United States Patent
Feng et al.

(10) Patent No.: US 10,627,233 B2
(45) Date of Patent: *Apr. 21, 2020

(54) SYSTEM AND METHOD FOR PROVIDING A SIMPLE AND RELIABLE INERTIA MEASUREMENT UNIT (IMU)

(71) Applicant: SZ DJI TECHNOLOGY CO., LTD., Shenzhen (CN)

(72) Inventors: Jiangang Feng, Shenzhen (CN); Yin Tang, Shenzhen (CN)

(73) Assignee: SZ DJI TECHNOLOGY CO., LTD., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/029,794

(22) Filed: Jul. 9, 2018

(65) Prior Publication Data

US 2019/0049245 A1 Feb. 14, 2019

Related U.S. Application Data

(63) Continuation of application No. 15/349,980, filed on Nov. 11, 2016, now Pat. No. 10,030,974, which is a (Continued)

(51) Int. Cl.
*G01C 19/00* (2013.01)
*G01P 1/00* (2006.01)
(Continued)

(52) U.S. Cl.
CPC ............ *G01C 19/00* (2013.01); *B64C 39/024* (2013.01); *G01C 19/5628* (2013.01);
(Continued)

(58) Field of Classification Search
CPC ............... G01C 19/56; G01C 19/5769; G01C 19/5783; G01C 19/5663; G01C 19/16;
(Continued)

(56) References Cited

U.S. PATENT DOCUMENTS 5,115,291 A 5/1992 Stokes
5,239,866 A 8/1993 Froidevaux
(Continued)

FOREIGN PATENT DOCUMENTS

CN 1821717 A 8/2006
CN 101349564 A 1/2009
(Continued)

OTHER PUBLICATIONS

The United States Patent and Trademark Office (USPTO) Notice of Allowance for U.S. Appl. No. 15/231,674, dated Oct. 27, 2017.
(Continued)

*Primary Examiner* — Helen C Kwok
(74) *Attorney, Agent, or Firm* — Anova Law Group, PLLC

(57) ABSTRACT

An inertia measurement unit including a housing assembly, a weight block assembly, a circuit board, and a signal line. The housing assembly includes a cavity and a first opening in communication with the cavity. The weight block assembly is arranged in the cavity of the housing assembly. The weight block assembly includes an inner chamber and a second opening in communication with the inner chamber. The circuit board is arranged in the inner chamber of the weight block assembly. The signal line is coupled to a first edge of the circuit board and extends out of the weight block assembly through the second opening and out of the housing assembly through the first opening. At least one of the first opening or the second opening is located proximal to a second edge of the circuit board that is different from the first edge of the circuit board.

19 Claims, 7 Drawing Sheets

Related U.S. Application Data continuation of application No. PCT/CN2015/076012, filed on Apr. 7, 2015.

(51) Int. Cl.
| | |
|---|---|
| *G01P 15/08* | (2006.01) |
| *G01C 19/5628* | (2012.01) |
| *G01C 21/26* | (2006.01) |
| *G01C 25/00* | (2006.01) |
| *B64C 39/02* | (2006.01) |
| *G01C 21/16* | (2006.01) |
| *H05K 7/20* | (2006.01) |
| *H01L 23/34* | (2006.01) |
| *H05K 1/18* | (2006.01) |

(52) U.S. Cl.
CPC ........... *G01C 21/16* (2013.01); *G01C 21/265* (2013.01); *G01C 25/00* (2013.01); *G01P 1/003* (2013.01); *G01P 15/0802* (2013.01); *H05K 7/20* (2013.01); *B64C 2201/141* (2013.01); *H01L 23/345* (2013.01); *H05K 1/189* (2013.01); *H05K 2201/10151* (2013.01)

(58) Field of Classification Search
CPC ....... G01C 21/265; G01C 21/16; G01P 1/023; G01P 1/02; G01P 1/003; G01P 15/0802; G01P 15/097; G01P 15/18; G01P 15/14; F16F 15/00

See application file for complete search history.

(56) References Cited

U.S. PATENT DOCUMENTS

| | | | |
|---|---|---|---|
| 5,546,644 | A | 8/1996 | Kakizaki et al. |
| 5,644,081 | A * | 7/1997 | Schwarz ................. G01P 1/023 |
| | | | 73/493 |
| 5,668,316 | A | 9/1997 | Iwai et al. |
| 6,145,380 | A | 11/2000 | MacGugan |
| 6,578,682 | B2 | 6/2003 | Braman et al. |
| 6,880,399 | B1 * | 4/2005 | Okoshi .............. G01C 19/5628 |
| | | | 73/493 |
| 7,603,903 | B2 | 10/2009 | Ohta |
| 7,891,244 | B2 | 2/2011 | Ohta et al. |
| 7,938,004 | B1 | 5/2011 | Brunsch et al. |
| 8,826,734 | B2 | 9/2014 | Ohkoshi et al. |
| 9,772,343 | B2 * | 9/2017 | Wang ..................... F16F 15/00 |
| 9,841,432 | B2 * | 12/2017 | Wang ..................... F16F 15/00 |
| 10,030,974 | B2 * | 7/2018 | Feng .................... G01C 21/265 |
| 2002/0065626 | A1 | 5/2002 | McCall et al. |
| 2004/0045520 | A1 | 3/2004 | Slopsema et al. |
| 2007/0074570 | A1 | 4/2007 | Braman et al. |
| 2007/0113702 | A1 | 5/2007 | Braman et al. |
| 2009/0308157 | A1 | 12/2009 | Eriksen et al. |
| 2010/0037694 | A1 | 2/2010 | Grossman |
| 2010/0257932 | A1 | 10/2010 | Braman et al. |
| 2013/0111993 | A1 | 5/2013 | Wang |
| 2014/0224014 | A1 | 8/2014 | Wang et al. |
| 2016/0349280 | A1 | 12/2016 | Wang et al. |
| 2018/0088143 | A1 | 3/2018 | Wang et al. |

FOREIGN PATENT DOCUMENTS

| | | |
|---|---|---|
| CN | 101750065 A | 6/2010 |
| CN | 101922938 A | 12/2010 |
| CN | 202274882 U | 6/2012 |
| CN | 102778232 A | 11/2012 |
| CN | 102980584 A | 3/2013 |
| CN | 103210280 A | 7/2013 |
| CN | 203037259 U | 7/2013 |
| CN | 203249935 U | 10/2013 |
| EP | 1788277 A2 | 5/2007 |
| JP | H04297837 A | 10/1992 |
| JP | 2002022761 A | 1/2002 |
| JP | 2007093329 A | 4/2007 |
| JP | 2007163471 A | 6/2007 |
| JP | 2009053005 A | 3/2009 |
| WO | 03029756 A1 | 4/2003 |
| WO | 2011140804 A1 | 11/2011 |

OTHER PUBLICATIONS

The United States Patent and Tradmark Office (USPTO) Notice of Allowance for U.S. Appl. No. 14/241,891, dated Aug. 8, 2017.
The United States Patent and Tradmark Office (USPTO) Office Action for U.S. Appl. No. 15/231,674, dated May 25, 2017.
The United States Patent and Tradmark Office (USPTO) Office Action for U.S. Appl. No. 14/241,891, dated Jun. 21, 2017.
Dayou, Noise and Vibration Control Engineering Handbook, China Machine Press, 2002, pp. 577-579.
Harris, et al., Shock and Vibration Handbook, Science Press, Dec. 1990, pp. 2, 19, 606, 610, and 611.
The United States Patent and Tradmark Office (USPTO) Notice of Allowance for U.S. Appl. No. 15/231,674, dated Mar. 30, 2017.
Zhu, et al., College Physics, Textbook Series in Physics for Higher Education, Tsinghua University Press, 2004. pp. 211-223.
The United States Patent and Tradmark Office (USPTO) Office Action for U.S. Appl. No. 15/231,674, dated Mar. 1, 2017.
The United States Patent and Tradmark Office (USPTO) Office Action for U.S. Appl. No. 14/241,891, dated Mar. 1, 2017.
The State Intellectual Property Office of the People's Republic of China (SIPO) Office Action for CN Application No. 201110260585, dated Mar. 3, 2016.
European Patent Office (EPO) Office Action for EP Application No. 11871565.5, dated Jun. 10, 2015.
European Patent Office (EPO) European Search Report for EP Application No. 11871565.5, dated Mar. 26, 2015.
World Intellectual Property Organization (WIPO) International Search Report and Written Opinion for PCT/CN2011/079705, dated Dec. 22, 2011.
Japan Patent Office (JPO) Japanese Office Action for JP Application 2014-527461, dated Jan. 22, 2015.
The United States Patent and Tradmark Office (USPTO) Office Action for U.S. Appl. No. 14/241,891, dated Feb. 11, 2016.
The United States Patent and Tradmark Office (USPTO) Office Action for U.S. Appl. No. 14/241,891, dated Jun. 28, 2016.
The United States Patent and Tradmark Office (USPTO) Office Action for U.S. Appl. No. 14/241,891, dated Sep. 27, 2016.
The United States Patent and Tradmark Office (USPTO) Office Action for U.S. Appl. No. 15/231,674, dated Oct. 3, 2016.
Norld Intellectual Property Organization (WIPO) International Search Report for International Application No. PCT/CN2015/076012 dated Jan. 20, 2016 5 pages.
World Intellectual Property Organization (WIPO) Written Opinion for International Application No. PCT/CN2015/076012 dated Jan. 20, 2016 4 pages.

* cited by examiner

SYSTEM AND METHOD FOR PROVIDING A SIMPLE AND RELIABLE INERTIA MEASUREMENT UNIT (IMU)

CROSS-REFERENCE TO RELATED APPLICATIONS

This application is a continuation application of application Ser. No. 15/349,980, filed on Nov. 11, 2016, which is a continuation application of International Application No. PCT/CN2015/076012, filed on Apr. 7, 2015, the entire contents of both of which are hereby incorporated by reference.

BACKGROUND OF THE DISCLOSURE

Unmanned movable objects such as the unmanned vehicles (e.g. the unmanned aircrafts) can be used for performing various surveillance, reconnaissance, and exploration tasks. An unmanned vehicle may include various sensing devices for determining the present control status and/or states. Thus, the unmanned vehicle can navigate autonomously or semi-autonomously. This is the general area that embodiments of the disclosure are intended to address.

BRIEF SUMMARY OF THE DISCLOSURE

Described herein are systems and methods that can provide a measurement module on a movable object. The measurement module includes a first circuit board with one or more sensors. Additionally, the measurement module includes a weight block assembly, wherein the weight block assembly is configured to have a mass that keeps an inherent frequency of the measurement module away from an operation frequency of the movable object. Furthermore, said first circuit board can be disposed in an inner chamber within the weight block assembly.

Other objects and features of the present disclosure will become apparent by a review of the specification, claims, and appended figures.

BRIEF DESCRIPTION OF THE DRAWINGS

The novel features of the invention are set forth with particularity in the appended claims. A better understanding of the features and advantages of the present disclosure will be obtained by reference to the following detailed description that sets forth illustrative embodiments, in which the principles of the disclosure are utilized, and the accompanying drawings briefly described herein.

DETAILED DESCRIPTION OF THE EMBODIMENTS

The disclosure is illustrated, by way of example and not by way of limitation, in the figures of the accompanying drawings in which like references indicate similar elements. It should be noted that references to "an" or "one" or "some" embodiment(s) in this disclosure are not necessarily to the same embodiment, and such references mean at least one.

The description of the disclosure as following uses an unmanned aircraft as example for a movable object. It will be apparent to those skilled in the art that other types of movable objects can be used without limitation.

A Vibration Model on an Unmanned Aircraft

In accordance with various embodiments of the present disclosure, a movable object, such as an unmanned aircraft, an unmanned vehicle, a hand held device, or a robot, can take advantage of a measurement module (or device) for obtaining various types of information that are necessary for controlling the movable object.

Figure 1:
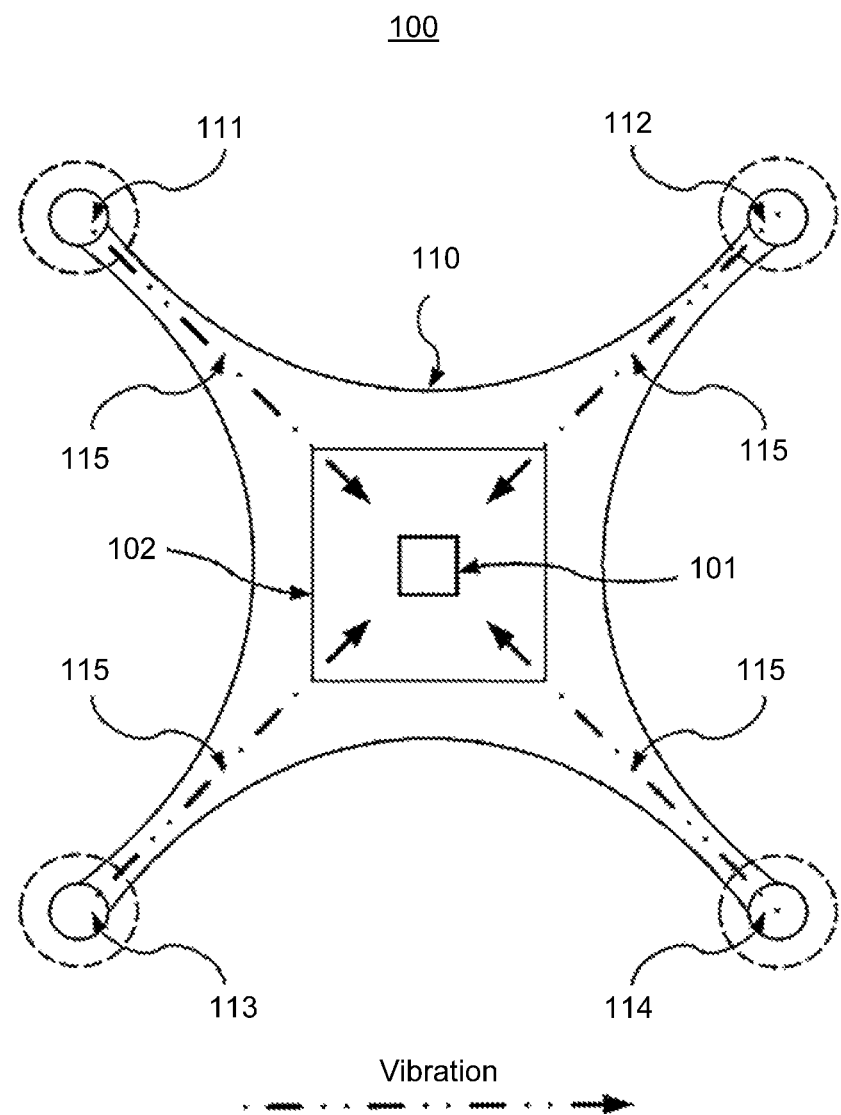
FIG. 1 is an exemplary illustration of a vibration model for an unmanned aircraft, in accordance with various embodiments of the present disclosure.

FIG. 1 is an exemplary illustration of a vibration model for an unmanned aircraft, in accordance with various embodiments of the present disclosure. As shown in FIG. 1, an unmanned aircraft 100 can use a measurement module, such as an inertia measurement unit (IMU) 101, for determining a spatial disposition (and other fly status parameters) for the unmanned aircraft 100.

The IMU 101 can include various types of inertia sensors, such as one or more integrated motion sensors and/or one or more integrated orientation sensors. For example, a motion sensor can include a velocity measurement instrument and/or an acceleration measurement instrument (e.g. an accelerometer), and an orientation sensor can include a gyroscope and a gravity gradient sensor (e.g. a gradiometer).

In accordance with various embodiments of the present disclosure, the IMU 101 can be placed on different suitable portions of a movable object, such as above, underneath, on the side(s) of, or within the body 110 of the movable object. The IMU 101 may be mechanically coupled to the movable object. Optionally, the IMU 101 can be physically integrated into the movable object.

As shown in FIG. 1, the IMU 101 may be placed on a body 110 of the unmanned aircraft 100, e.g. with a main circuit board 102. The main circuit board 102 can include a control module, which contains various logics for controlling the flight status of the unmanned aircraft 100. The IMU 101 can be electronically coupled with the control module on the unmanned aircraft 100. Then, the IMU 101 can measure the spatial disposition and/or motion of the unmanned aircraft 100.

Additionally, different vibration sources may be presented on a movable object. The vibration may severely deteriorate the precision and stability of the measurement performed by the IMU 101. Thus, the vibration can be detrimental to the control of the movable object, since the measurement result of the IMU 101 is important for determining various control parameters.

As shown in FIG. 1, an unmanned aircraft 100 may have one or more motors, each of which can be a vibration source. The vibration 115 may propagate from the motors 111-114, along the body of the unmanned aircraft 100, to the IMU 101.

In accordance with various embodiments of the present disclosure, a measurement module, such as the IMU 101, can provide vibration damping for improving measurement stability. For example, the IMU 101 can be coupled to a support base carried by the unmanned aircraft 100 via various damping elements. The amount of damping provided by the damping elements may be optimized based on the types of the inertia sensor in the IMU 101.

Figure 2:
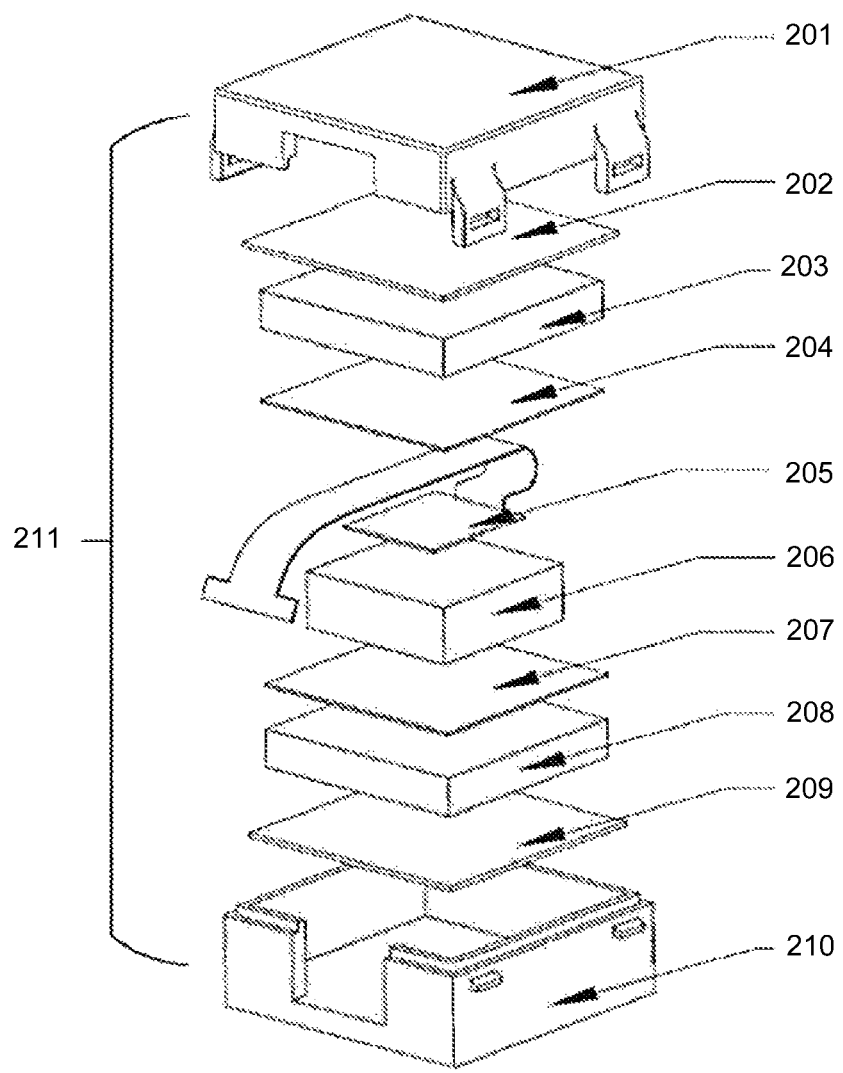
FIG. 2 is an exemplary illustration of an exploded view for an inertia measurement unit (IMU) with vibration damping, in accordance with various embodiments of the present disclosure.

FIG. 2 is an exemplary illustration of an exploded view for an inertia measurement unit (IMU) with vibration damping, in accordance with various embodiments of the present disclosure. As shown in FIG. 2, a housing assembly 211 in an IMU 200 includes a first housing member 201 and a second housing member 210, which can be mated and locked together.

The IMU 200 further includes a circuit board 205, on which various types of sensors that are sensitive to vibration (such as an inertia sensor) can be disposed. In order to prevent the vibration from deteriorating the performance of such sensors, the circuit board 205 can be made using flexible materials. Alternatively, these sensors, which are sensitive to vibration, can be integrated into the circuit board 205.

In accordance with various embodiments of the present disclosure, the IMU 200 can use a weight block 206 for decreasing the inherent frequency of the IMU 200. The inherent frequency of the IMU 200 can be defined using the following equation, $$f_n = \frac{1}{2\pi}\sqrt{\frac{k}{m}},$$

where K represents the elastic coefficient and M represents the mass. Thus, the weight block 206 can be configured to have a mass that can keep the inherent frequency of the IMU 200 away from the operation frequency of an unmanned aircraft, e.g. 50~200 Hz.

As shown in FIG. 2, the circuit board 205 can be placed on a surface of the weight block 206 (e.g. being fixed on the top surface of the weight block 206). Alternatively, the circuit board 205 may be buried in a recessed area on a surface of the weight block 206, e.g. using black glues.

Additionally, the weight block 206, which provides support for the circuit board 205, can be placed in the housing assembly 211 with vibration reducing films 204 and 207 and foams 203 and 208, which can further reduce the vibration.

In accordance with various embodiments of the present disclosure, adhesive materials (e.g. a double-sided tape 209) can be used to fix the weight block 206, the vibration reducing films 204 and 207 and the foams 203 and 208 in the housing assembly 211.

Additionally, in order to assemble the IMU 200 with satisfactory precision, various tools, such as jig tools, may be used for handling the various components 203-208 appropriately in the housing assembly 211. Also, a positioning device, e.g. a positioning film 202, can be used for precisely placing the different components 203-208 in the housing assembly 200, e.g. on an inner surface of the housing assembly 211.

A Simple and Reliable Inertia Measurement Unit (IMU)

Figure 3:
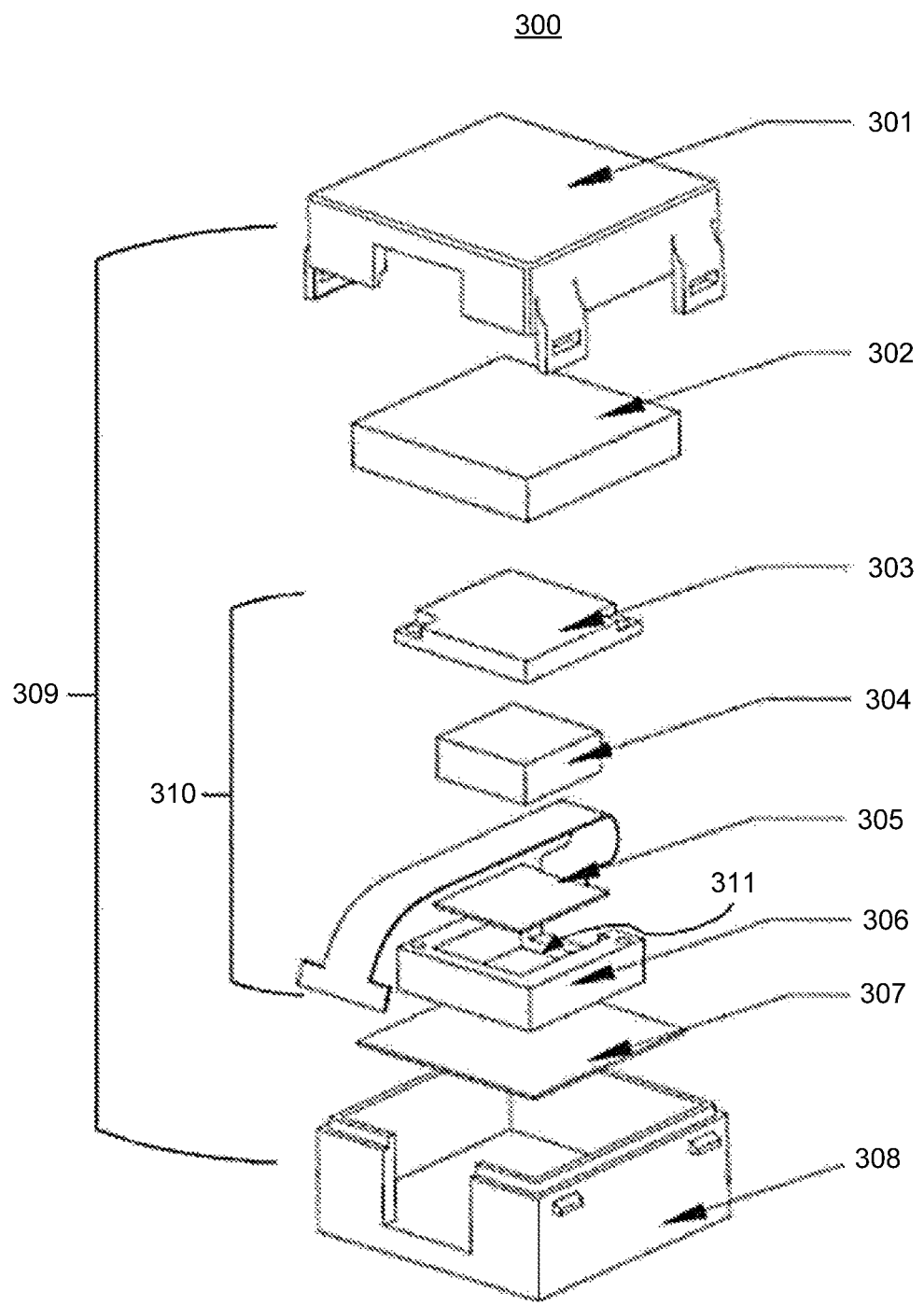
FIG. 3 is an exemplary illustration of an exploded view for a simple and reliable inertia measurement unit (IMU), in accordance with various embodiments of the present disclosure.

FIG. 3 is an exemplary illustration of an exploded view for a simple and reliable inertia measurement unit (IMU), in accordance with various embodiments of the present disclosure. As shown in FIG. 3, a housing assembly 309 in an IMU 300 includes a first housing member 301 and a second housing member 308 that can be mated and locked together.

In accordance with various embodiments of the present disclosure, the IMU 300 can include a weight block assembly 310. The weight block assembly 310 can be configured to have a mass that can keep the inherent frequency of the IMU 300 away from the operation frequency of the unmanned aircraft (e.g. 50~200 Hz).

The IMU 300 further includes a circuit board 305, on which different types of sensors sensitive to vibration (such as an inertia sensor) can be disposed. In order to prevent the vibration from deteriorating the performance of such sensors, the circuit board 305 may be made using flexible materials. Alternatively, these sensors, which are sensitive to vibration, can be physically integrated into the circuit board 305.

As shown in FIG. 3, the weight block assembly 310 may include a first weight block 303 and a second weight block 306, which can be tightly coupled to form a weight block assembly 310 with an inner chamber 311. Furthermore, the circuit board 305, which includes an inertia sensor, can be disposed in the inner chamber 311. In other words, the weight block assembly 310 is configured to have an inner chamber that is adapted to contain the circuit board 305 with one or more sensors that support the IMU 300.

In accordance with various embodiments of the present disclosure, different coupling mechanisms can be used to tightly couple the first weight block 303 and the second weight block 307 together (i.e., to form the weight block assembly 310). Suitable coupling mechanisms can be based on adhesives, bonding, welding, and/or fasteners (e.g. screws, nails, pins, etc.). Also, the weight block assembly 310 can be fixed in the housing assembly 300 using foams 302 and/or adhesive materials 307.

Additionally, a thermal interface material 304, which is compressible, can be used to fill in the gap in the inner chamber 311. The thermal interface material 304 can conduct heat away from the circuit board 305 and prevents the circuit board 305 from moving inside the inner chamber 311 within the weight block assembly 310. For example, the thermal interface material 304 may be based on silica gel, thermal gel, epoxy, phase change materials, polyimide, graphite, aluminum tapes, and/or silicone-coated fabrics.

In accordance with various embodiments of the present disclosure, the assembly process for the IMU 300 is straight forward and the size of the IMU 300 can be reduced, since the structure of the IMU 300 is simple. For example, the foams 302 can be preinstalled in a housing member 301 or 308. Furthermore, there is no need of using special tools to handle and position the various components 302-307 in the housing assembly 309. Also, the assembly process does not involve glues, such as black glues, which are difficult to handle. Also, the performance of the IMU 300 is reliable, since the circuit board 305 is disposed in the inner chamber 311 of the weight block assembly 310 along with a compressible thermal interface material 304.

Figure 4:
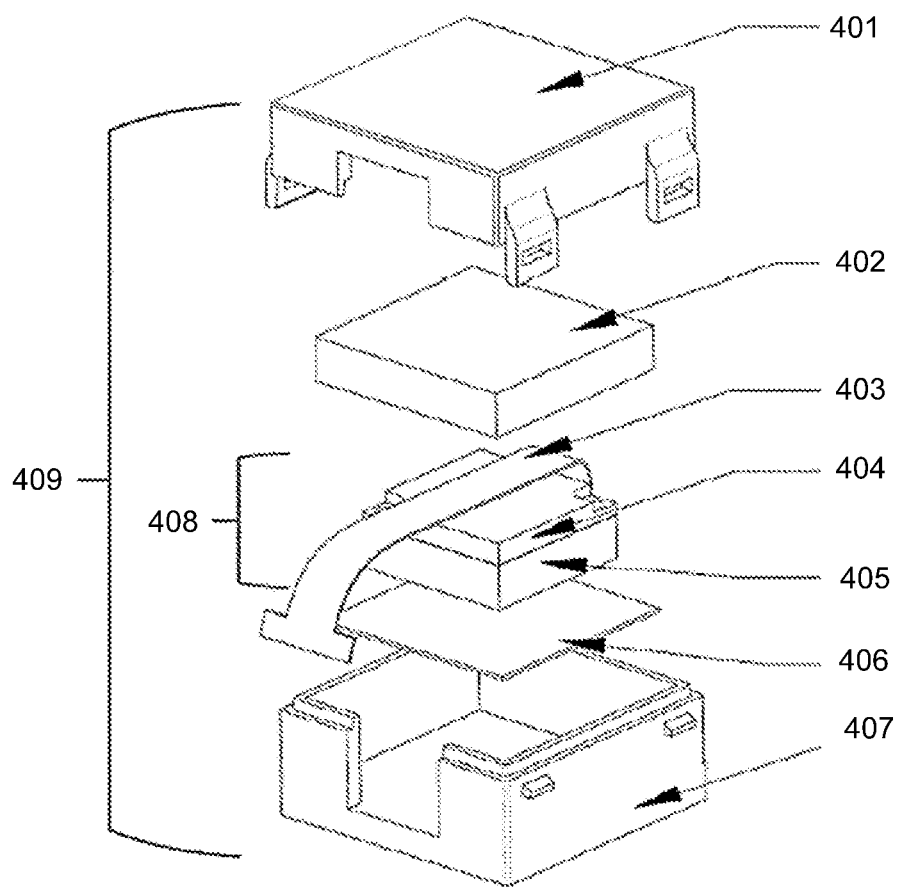
FIG. 4 is an exemplary illustration of a partially assembled inertia measurement unit (IMU), in accordance with various embodiments of the present disclosure.

FIG. 4 is an exemplary illustration of a partially assembled inertia measurement unit (IMU), in accordance with various embodiments of the present disclosure. As shown in FIG. 4, a housing assembly 409 in an IMU 400 includes a first housing member 401 and a second housing member 407 that can be mated and locked with each other.

The IMU 400 can include a weight block assembly 408, which can be configured to have a mass that can keep the inherent frequency of the IMU away from the operation frequency of the unmanned aircraft, e.g. 50~200 Hz.

The weight block assembly 408 can contain a circuit board (not shown) with various types of sensors that are sensitive to vibration (such as an inertia sensor). Additionally, a flexible signal line 403, which connects to the circuit board in the weight block assembly 408, can be held (or stabilized) on an outside surface (e.g. the top surface) of the weight block assembly 408 to avoid unwanted shift and/or disturbance.

In accordance with various embodiments of the present disclosure, the weight block assembly 408 may have different configurations. For example, the weight block assembly 408 can be a single weight block with an inner chamber (or a cavity). Alternatively, the weight block assembly 408 can be formed with multiple members or sections (such as the weight blocks 404-405), which can be tightly coupled to form an inner chamber.

Additionally, the weight block assembly 408 may be in different geometry shapes. For example, the weight block assembly 408 can be in a cubic shape, a cylinder shape, a spherical shape, an oval shape, a three dimensional polygonal shape, etc.

As shown in FIG. 4, the weight block assembly 408 can be placed in the housing assembly 409 with foams 402 and/or adhesive materials 406, which prevent the weight block assembly 408 from unnecessary movements. Furthermore, the foams 402 can be configured to reduce the vibration that may affect the performance of the sensors in the IMU 400. Additionally, the foams 402 can ensure that the IMU 400 is working in a satisfactory range of humidity and temperature, which are beneficial in achieving the desired precision in the measurement.

Figure 5:
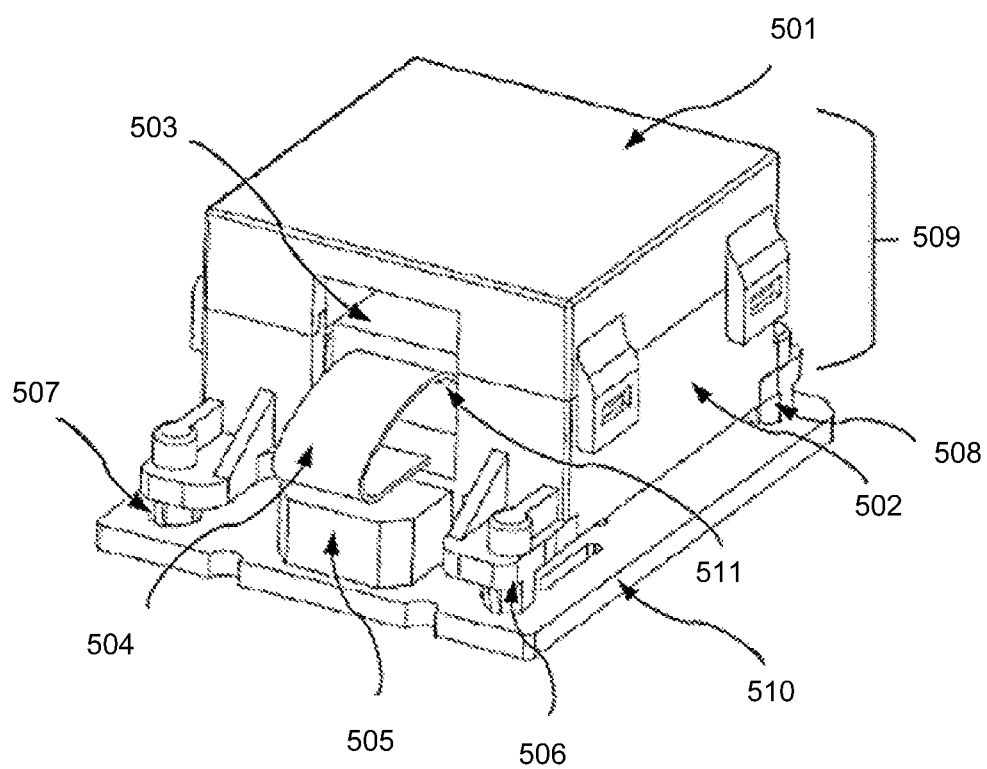
FIG. 5 is an exemplary illustration of an assembled inertia measurement unit (IMU), in accordance with various embodiments of the present disclosure.

FIG. 5 is an exemplary illustration of an assembled inertia measurement unit (IMU), in accordance with various embodiments of the present disclosure. As shown in FIG. 5, an IMU 500 includes a housing assembly 509 with a first housing member 501 and a second housing member 502 that are mated and locked with each other.

Furthermore, the housing assembly 509 can be placed on a circuit board 510 using different coupling method, e.g. coupling bolts 506-508. For example, the circuit board 510 may be a control board, or a main circuit board, for an unmanned aircraft. Additionally, the circuit board 510 can include a barometer and necessary heating devices for maintaining a satisfactory temperature for the measurement environment.

In accordance with various embodiments of the present disclosure, the IMU 500 can include a weight block assembly 503, which is placed inside the housing assembly 509 (i.e. in an inner chamber within the housing assembly 509). The weight block assembly 509 can be configured to have a mass that can keep the inherent frequency of the IMU away from the operation frequency of the unmanned aircraft (e.g. 50~200 Hz).

Furthermore, the weight block assembly 503 can include a circuit board (not shown) with an inertia sensor, which can be disposed in an inner chamber in the weight block assembly 503.

Additionally, a flexible signal line 504 can pass through an opening 511 on the weight block assembly 503 and connects the circuit board in the weight block assembly 503 with the circuit board 510, e.g. using a plug-in device 505. Alternatively the circuit board in the weight block assembly 503 can be electronically connected with the circuit board 510 via different wireless communication protocols.

Figure 6:
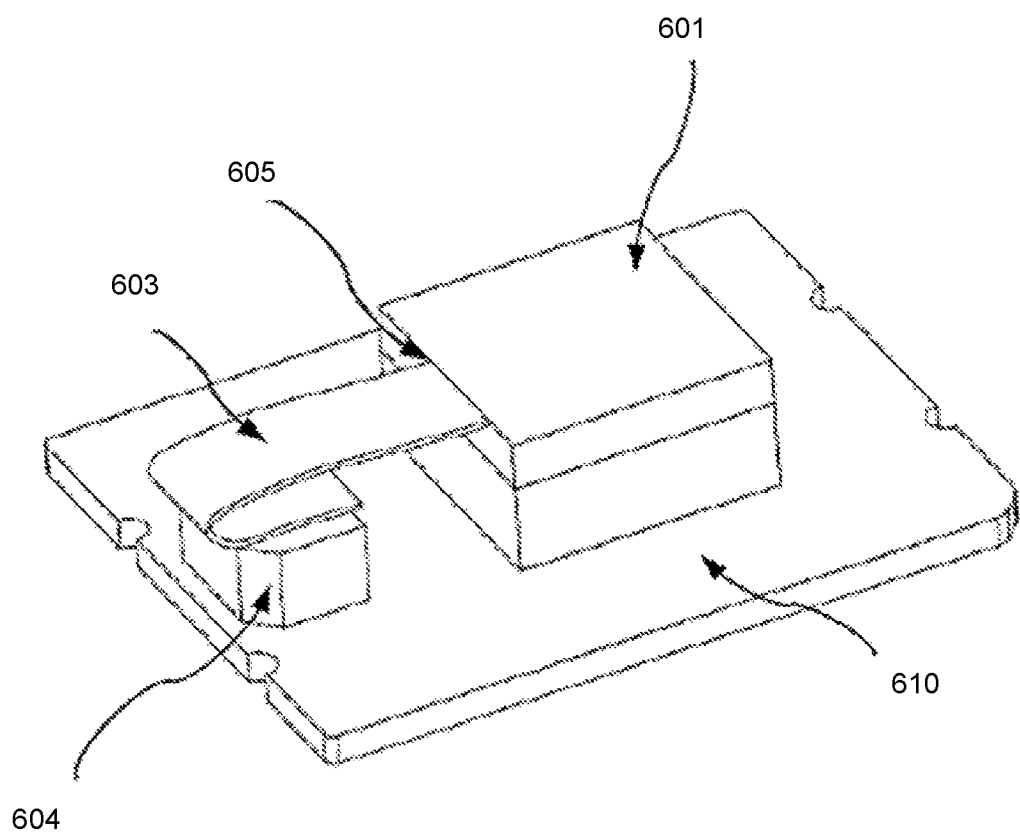
FIG. 6 is an exemplary illustration of an alternative inertia measurement unit (IMU), in accordance with various embodiments of the present disclosure.

FIG. 6 is an exemplary illustration of an alternative inertia measurement unit (IMU), in accordance with various embodiments of the present disclosure. As shown in FIG. 6, an IMU 600 includes a weight block assembly 601, which includes a circuit board (not shown) with an inertia sensor. Additionally, the weight block assembly 601 may have different configurations and may be in different shapes.

In accordance with various embodiments of the present disclosure, the weight block assembly 601 can be placed directly on a circuit board 610. Alternatively, a vibration attenuation cushion (not shown) can be placed between the weight block assembly 601 and the circuit board 610. Thus, the structure of the IMU 600 can be further simplified and the size of the IMU 600 can be substantially reduced.

As shown in FIG. 6, a flexible signal line 604 can connect the circuit board in the weight block assembly 603 with a circuit board 610, e.g. using a plug-in device 604. Alternatively, the circuit board in the weight block assembly 601 can be electronically connected with the circuit board 610 via different wireless communication protocols.

Here, the circuit board 610 can be a control board or a main circuit board for an unmanned aircraft. For example, the circuit board 610 can include a barometer and necessary heating devices to maintain a satisfactory temperature in the measurement environment.

Figure 7:
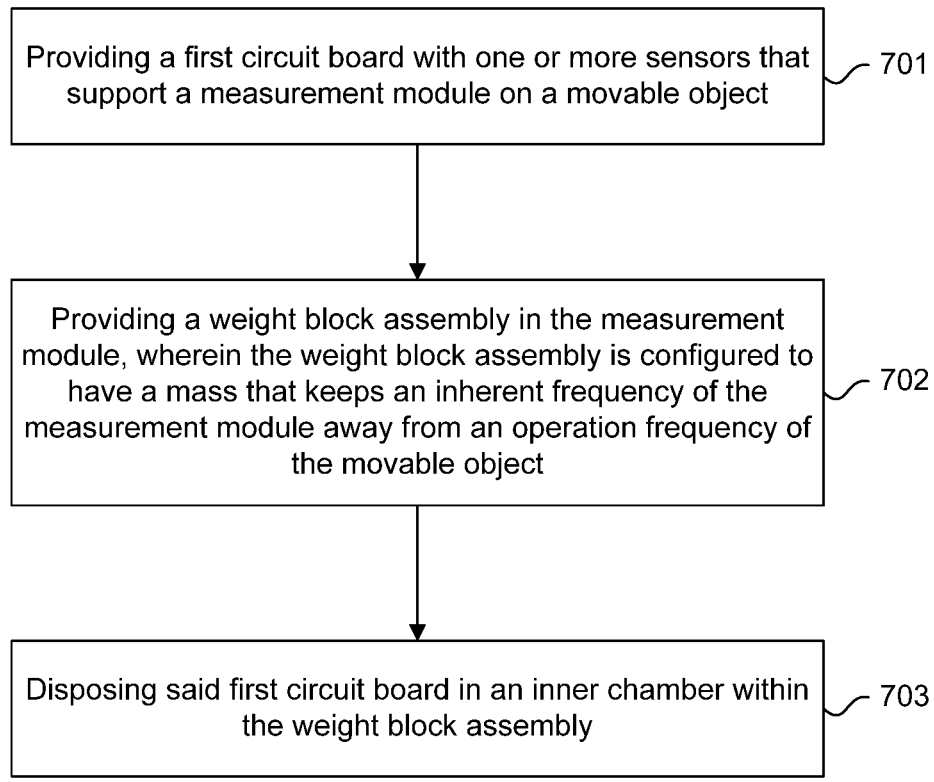
FIG. 7 shows a flowchart of providing a measurement module on a movable object, in accordance with various embodiments of the present disclosure.

FIG. 7 shows a flowchart of providing a measurement module on a movable object, in accordance with various embodiments of the present disclosure. As shown in FIG. 7, at step 701, a first circuit board may be provided with one or more sensors that support the measurement module. Furthermore, at step 702, a weight block assembly may be provided in the measurement module, wherein the weight block assembly is configured to have a mass that keeps an inherent frequency of the measurement module away from an operation frequency of the movable object. Then, at step 703, said first circuit board can be disposed in an inner chamber of the weight block assembly.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications and combinations that are suited to the particular use contemplated. It is intended that the scope of the disclosure be defined by the following claims and their equivalence.

While some embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the invention and that methods and structures within the scope of these claims and their equivalents be covered thereby.

The invention claimed is:

1. An inertia measurement unit (IMU) comprising:
   a housing assembly including a cavity and a first opening in communication with the cavity;
   a weight block assembly arranged in the cavity of the housing assembly, the weight block assembly including an inner chamber and a second opening in communication with the inner chamber;
   a circuit board arranged in the inner chamber of the weight block assembly; and
   a signal line coupled to a first edge of the circuit board and extending out of the weight block assembly through the second opening and out of the housing assembly through the first opening;
   wherein at least one of the first opening or the second opening is located proximal to a second edge of the circuit board that is opposite to the first edge of the circuit board.

2. The IMU of claim 1, wherein the circuit board includes one or more sensors that are sensitive to vibration.

3. The IMU of claim 2, wherein the one or more sensors includes an inertia sensor.

4. The IMU of claim 3, wherein the inertia sensor includes at least one of:
   a motion sensor including at least one of a velocity measurement instrument or an acceleration measurement instrument; or
   an orientation sensor including at least one of a gyroscope or a gravity gradient sensor.

5. The IMU of claim 1, wherein the weight block assembly includes a first weight block and a second weight block coupled together to form the inner chamber.

6. The IMU of claim 1, further comprising:
   a thermal interface material filling a gap in the inner chamber.

7. The IMU of claim 6, wherein the thermal interface material is based on at least one of silica gel, thermal gel, epoxy, a phase change material, polyimide, graphite, an aluminum tape, or a silicone-coated fabric.

8. The IMU of claim 1, wherein the signal line includes a bent portion near the first edge of the circuit board.

9. The IMU of claim 1, wherein the signal line includes a portion held on an outside surface of the weight block assembly.

10. The IMU of claim 1, wherein the housing assembly includes a first housing member and a second housing member locked together to form the cavity.

11. The IMU of claim 1, further comprising:
    at least one of an adhesive layer or a form layer arranged in the cavity and fixing the weight block assembly in the cavity.

12. The IMU of claim 1,
    wherein the circuit board is a first circuit board;
    the IMU further comprising:
      a second circuit board arranged outside the housing assembly;
      wherein the signal line is further coupled to the second circuit board through a plug-in device.

13. The IMU of claim 12, wherein the second circuit board includes a control board for an unmanned aircraft, the control board including at least one of a barometer or a heating device.

14. An unmanned aircraft comprising:
    a body; and
    an inertia measurement unit (IMU) configured to determining a spatial disposition for the unmanned aircraft, the IMU including:
      a housing assembly including a cavity and a first opening in communication with the cavity;
      a weight block assembly arranged in the cavity of the housing assembly, the weight block assembly including an inner chamber and a second opening in communication with the inner chamber;
      a circuit board arranged in the inner chamber of the weight block assembly; and
      a signal line coupled to a first edge of the circuit board and extending out of the weight block assembly through the second opening and out of the housing assembly through the first opening;
      wherein at least one of the first opening or the second opening is located proximal to a second edge of the circuit board that is opposite to the first edge of the circuit board.

15. The unmanned aircraft of claim 14, wherein the weight block assembly has a mass that keeps an inherent frequency of the IMU away from an operation frequency of the unmanned aircraft.

16. The unmanned aircraft of claim 15, wherein the mass of the weight block assembly keeps the inherent frequency of the IMU outside a range from 50 Hz to 200 Hz.

17. The unmanned aircraft of claim 14, further comprising:
    a support base; and
    one or more damping elements coupling the IMU to the support base.

18. The unmanned aircraft of claim 14, further comprising:
    one or more motors.

19. The IMU of claim 1, wherein the signal line extends out of the weight block assembly through the second opening along a first direction and is bent back to extend over the weight block assembly along a second direction that is opposite to the first direction.